United States Patent
Yang et al.

(10) Patent No.: US 8,902,669 B2
(45) Date of Patent: Dec. 2, 2014

(54) FLASH MEMORY WITH DATA RETENTION BIAS

(71) Applicant: SanDisk Technologies Inc., Plano, TX (US)

(72) Inventors: Nian Niles Yang, Mountain View, CA (US); Ryan Takafuji, San Jose, CA (US); Chris Nga Yee Avila, Saratoga, CA (US)

(73) Assignee: SanDisk Technologies, Inc., Plano, TX (US)

( * ) Notice: Subject to any disclaimer, the term of this patent is extended or adjusted under 35 U.S.C. 154(b) by 111 days.

(21) Appl. No.: 13/672,184

(22) Filed: Nov. 8, 2012

(65) Prior Publication Data

US 2014/0126292 A1    May 8, 2014

(51) Int. Cl.
- *G11C 16/06* (2006.01)
- *G11C 16/34* (2006.01)
- *G11C 7/04* (2006.01)
- *G11C 16/08* (2006.01)

(52) U.S. Cl.
CPC .............. *G11C 16/06* (2013.01); *G11C 16/349* (2013.01); *G11C 7/04* (2013.01); *G11C 16/08* (2013.01)
USPC .................................. 365/185.25; 365/185.18

(58) Field of Classification Search
USPC ........................................ 365/185.18, 185.25
See application file for complete search history.

(56) References Cited

U.S. PATENT DOCUMENTS

| | | | |
|---|---|---|---|
| 5,172,338 A | 12/1992 | Mehrotra et al. | |
| 5,570,315 A | 10/1996 | Tanaka et al. | |
| 5,768,192 A | 6/1998 | Eitan | |
| 5,774,397 A | 6/1998 | Endoh et al. | |
| 6,011,725 A | 1/2000 | Eitan | |
| 6,046,935 A | 4/2000 | Takeuchi et al. | |
| 6,205,074 B1 | 3/2001 | Van Buskirk et al. | |
| 6,269,026 B1 | 7/2001 | Venkatesh et al. | |
| 6,859,397 B2 | 2/2005 | Lutze et al. | |
| 7,940,568 B1 | 5/2011 | Chiavarone et al. | |
| 7,951,669 B2 | 5/2011 | Harari et al. | |
| 2002/0126533 A1 | 9/2002 | Kao | |
| 2008/0158970 A1 | 7/2008 | Sekar et al. | |
| 2009/0044085 A1 | 2/2009 | Zeng | |
| 2009/0207666 A1* | 8/2009 | Park et al. | 365/185.25 |
| 2009/0273984 A1* | 11/2009 | Tanzawa | 365/185.25 |
| 2010/0061146 A1 | 3/2010 | Choi et al. | |
| 2010/0073069 A1 | 3/2010 | Wang et al. | |
| 2012/0218823 A1 | 8/2012 | Tanzawa | |
| 2013/0007543 A1* | 1/2013 | Goss et al. | 714/718 |
| 2013/0223150 A1* | 8/2013 | Tanzawa | 365/185.17 |

OTHER PUBLICATIONS

Technical Search Report, Aug. 20, 2012, 7 pages.
Eitan et al,, "NROM: A Novel Localized Trapping, 2-Bit Nonvolatile Memory Cell," *IEEE Electron Device Letters*, Vol, 21, No, 11, Nov. 2000, pp. 543-545.
U.S. Appl. No. 13/658,292, filed Oct. 23, 2012, 27 pages.
Notification of Transmittal of the International Search Report and the Written Opinion of the International Searching Authority, or the Declaration for Int'l Application No. PCT/US2013/066367 mailed Dec. 20, 2013, 12 pages.

* cited by examiner

*Primary Examiner* — Hoai V Ho
(74) *Attorney, Agent, or Firm* — Davis Wright Tremaine LLP

(57) ABSTRACT

Charge leakage from a floating gate in a NAND flash memory die is reduced by applying a data retention bias to a word line extending over the floating gates. The data retention bias is applied to one or more selected word lines when the memory die is in idle mode, when no read, write, erase, or other commands are being executed in the memory die.

15 Claims, 7 Drawing Sheets

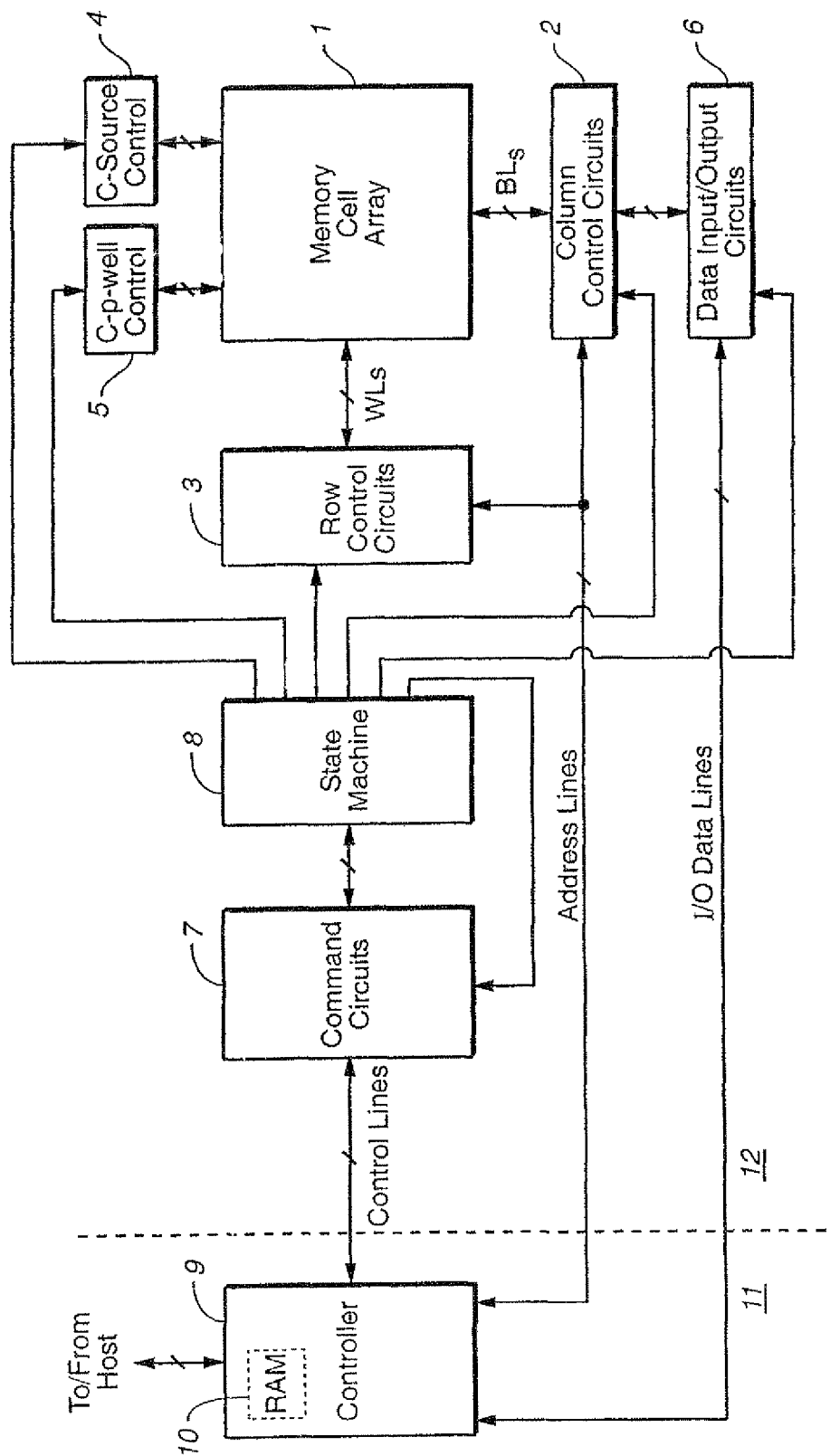
FIG._1
(Prior Art)

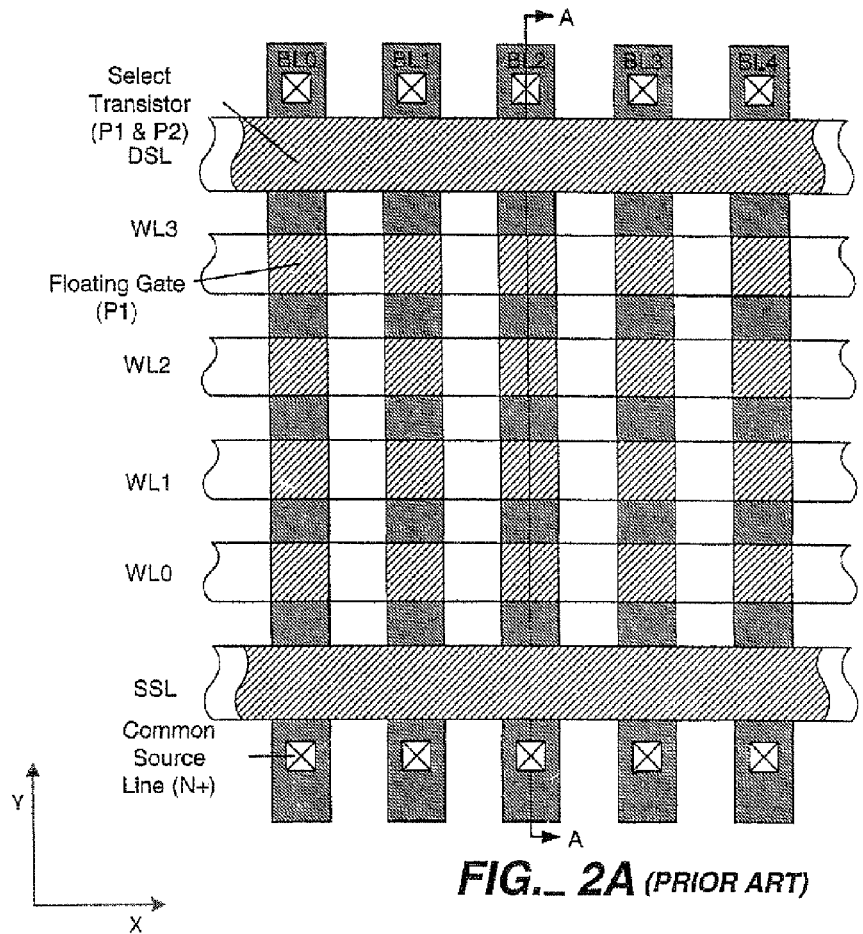
FIG._ 2A (PRIOR ART)
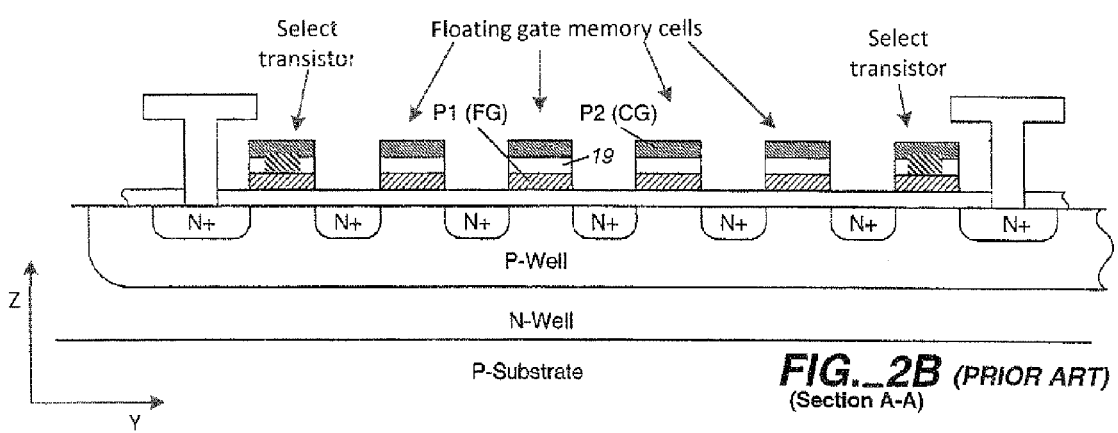
FIG._ 2B (PRIOR ART)
(Section A-A)

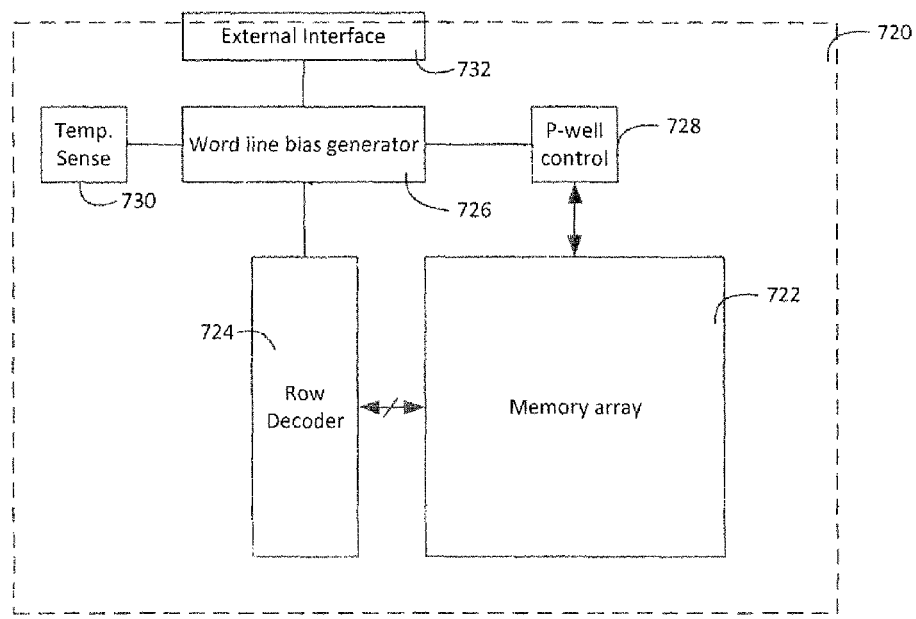
FIG. 7
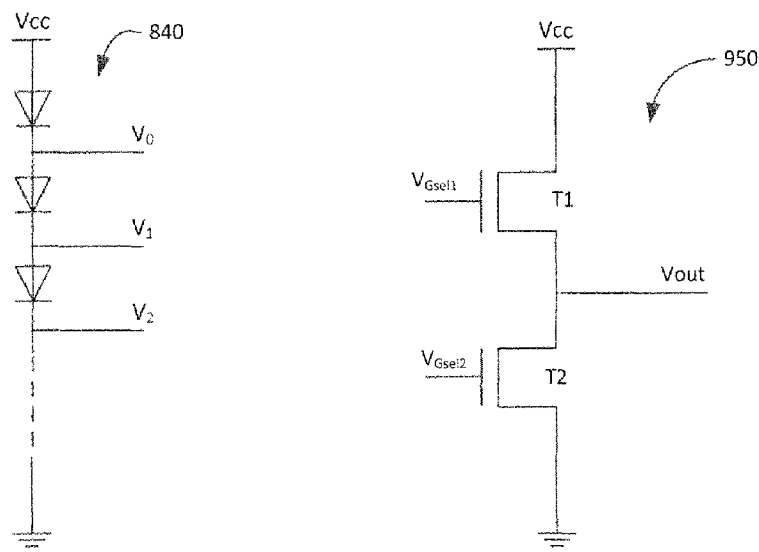
FIG. 8　　　　　FIG. 9

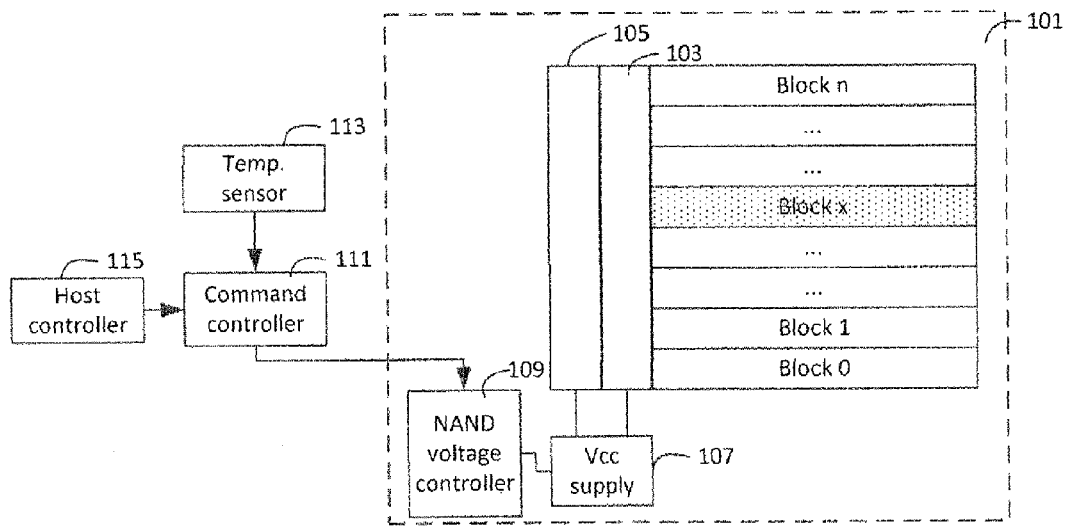
FIG. 10
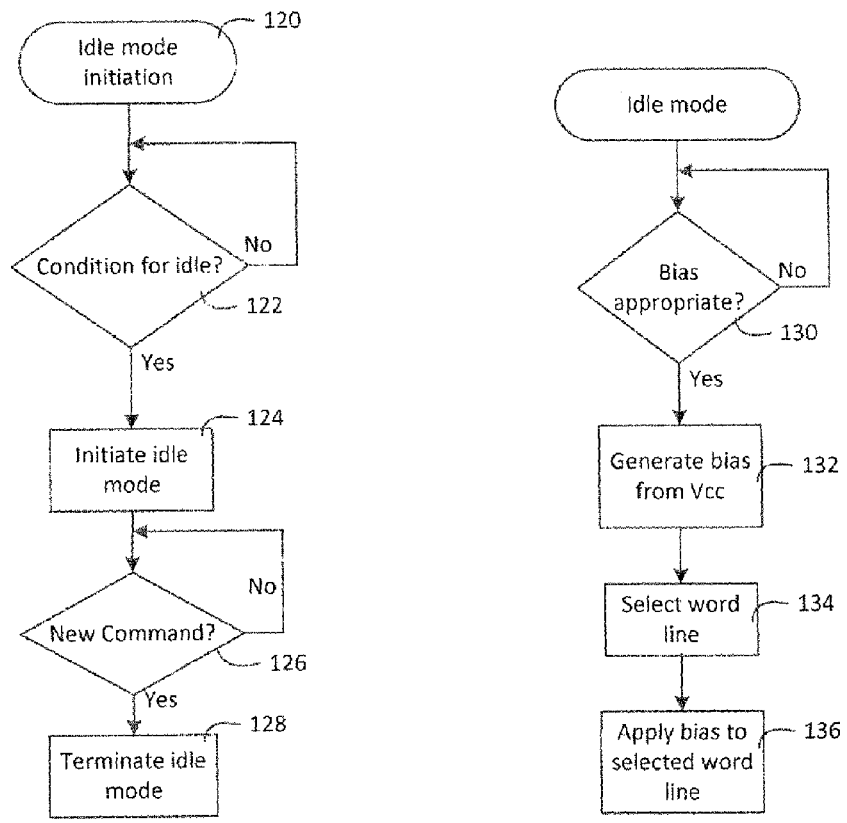
FIG. 11          FIG. 12

FLASH MEMORY WITH DATA RETENTION BIAS

BACKGROUND OF THE INVENTION

This invention relates generally to non-volatile semiconductor memories of the flash EEPROM (Electrically Erasable and Programmable Read Only Memory) type, their formation, structure and use, and specifically to structures and methods for applying a bias to one or more word lines when a memory die is idle so that data retention is improved.

There are many commercially successful non-volatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates. Control gate lines and string select lines are formed of polysilicon (polysilicon layer 2, or "poly 2," labeled P2 in FIG. 2B, a cross-section along line A-A of FIG. 2A). Floating gates are also formed of polysilicon (polysilicon layer 1, or "poly 1," labeled P1). The control gate lines are typically formed over the floating gates as a self-aligned stack, and are capacitively coupled with each other through an intermediate dielectric layer 19 (also referred to as "inter-poly dielectric" or "IPD") as shown in FIG. 2B. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Like all integrated circuits, memory arrays tend to have smaller dimensions from one generation to the next. This creates several problems. One problem, in memory cells that use a charge storage element, is that smaller cells usually have shorter data retention times. As dimensions get smaller, this problem generally becomes more acute. Therefore, there is a need for a NAND flash memory array with high data retention.

SUMMARY OF THE INVENTION

According to aspects of the present invention, a data retention bias is applied to one or more word lines in order to reduce the probability of electrons leaking from underlying floating gates through a gate dielectric. A data retention bias is applied when the memory die is idle and is not executing any command from a host or memory controller. The data retention bias may be maintained for extended periods (from seconds to years) when the memory die is inactive. In some cases, data retention bias may only be applied to selected word lines that contain critical data, or that are selected based on their physical characteristics. A data retention bias may only be applied at selected times based on the ambient temperature, or the availability of power, or other factors, or a combination of these or other factors.

An example of a method of operating a nonvolatile charge storage memory die includes: applying a data retention bias to a word line that overlies a plurality of programmed charge storage elements, during an idle period when the nonvolatile charge storage memory die is idle.

The data retention bias may reduce the probability of change in charge stored in the plurality of charge storage elements underlying the word line during the idle period. The temperature of the nonvolatile memory may be sensed, and the data retention bias may be applied in response to determining that the temperature of the nonvolatile charge storage memory die exceeds a predetermined temperature. The data retention bias may be applied to the word line in response to determining that the plurality of programmed charge storage elements contains data that is particularly important, and no data retention bias may be applied to other word lines of the nonvolatile charge storage memory die. The data retention bias may be applied to the word line in response to determining that the plurality of programmed charge storage elements have a high wear-count, and no data retention bias may be applied to other word lines of the nonvolatile charge storage memory die. The data retention bias may be applied as a continuous bias over the idle period, and the idle period is more than a minute. All bit lines coupled to the plurality of charge storage units may be at a uniform potential during the idle period.

An example of a nonvolatile charge storage memory die includes: a plurality of nonvolatile memory cells each including a charge storage element; a plurality of word lines extending in a first direction, each word line overlying charge storage elements; and a word line bias generator that provides a data retention bias to a word line of the plurality of word lines during an idle period when the memory die is idle.

The nonvolatile memory die may include: a temperature detection circuit that detects when the temperature of the nonvolatile memory die exceeds a threshold temperature, the temperature detection circuit having an output that indicates when the temperature exceeds the threshold temperature, the output connected to the word line bias generator. The nonvolatile memory die may include: a temperature detection circuit that receives an indication of temperature from an external temperature sensor, the temperature detection circuit having an output that indicates when the temperature exceeds a threshold temperature, the output connected to the word line bias generator. The nonvolatile memory die may include a word line decoder circuit connected between the word line bias generator and the plurality of word lines, the word line decoder circuit selecting the word line of the plurality of word lines for the data retention bias and while selecting other word lines of the plurality of word lines. The word line decoder circuit may select two or more word lines of the plurality of word lines for the data retention bias while not selecting all other word lines of the plurality of word lines for the data retention bias. The word line bias generator may receive an input at a voltage that is a power supply voltage (e.g. VDD, VCC, VDDQ, or VCCQ), from a source external to the nonvolatile memory die, and may generate the data retention bias, which is a fraction of the supply voltage. The word line bias generator may include a plurality of junctions connected in series, with a predetermined voltage drop across each junction, and an electrical output available at each junction, the data retention bias provided by the electrical output of a selected junction that is a selected number of predetermined voltage drops lower than the supply voltage (or equal to the supply voltage if selected number of predetermined voltage drops equals zero). The word line bias generator may include a voltage divider with a variable voltage output. The data retention bias may be selected from the variable voltage output such that the data retention bias is sufficient to reduce the probability of electron loss for charge storage elements under the word line and is not sufficient to cause electrons to be added to charge storage elements under the word line.

An example of a method of maintaining data in a charge storage element of a flash memory array includes: initiating an idle mode in response to determining that a supply voltage is expected to be maintained to the flash memory array, and that no read, write, or erase operations are to be performed in the flash memory array; and subsequently, in idle mode: generating a bias from the supply voltage; selecting a word line of the flash memory array; applying the bias to the word line; and maintaining the idle mode until a command is received.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

BRIEF DESCRIPTION OF THE DRAWINGS

FIG. 1 is a block diagram of a prior art memory system.

FIG. 2A is a plan view of a prior art NAND array.

FIG. 2B is a cross-sectional view of the prior art NAND array of FIG. 2A taken along the line A-A.

FIG. 7 shows circuits of a memory die including a word line bias generator.

FIG. 8 shows an example of a voltage reduction circuit.

FIG. 9 shows another example of a voltage reduction circuit.

FIG. 10 shows an example of a memory die with a data retention bias applied on a block-by-block basis.

FIG. 11 is a flowchart for idle mode initiation.

FIG. 12 is a flowchart for idle mode execution.

DETAILED DESCRIPTION OF EXEMPLARY EMBODIMENTS

Memory System

Figure 3:
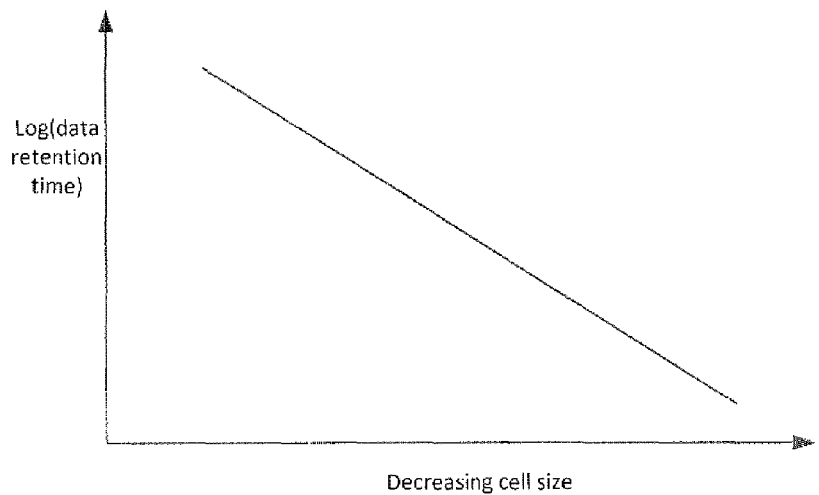
FIG. 3 shows flash memory data retention time as a function of cell size.

An example of a prior art memory system, which may be modified to include various aspects of the present invention, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

Many prior art memory systems contain a NAND flash memory array as shown in FIG. 2A and FIG. 2B. However, such memory arrays suffer from several problems. Some of these problems get worse as device sizes scale downwards.

One problem that occurs in NAND flash memory arrays is related to retention of data that is written in flash memory cells. In particular, after flash memory cells have been programmed to a particular memory state, and verified as being in that memory state, in a read-verify step, the cells may change over some period of time so that when they are read at a later time, their apparent states are not the states that were initially programmed. For example, electrical charge that is added to a floating gate or other charge storage element during programming may leak from the charge storage element over time. Such leakage of charge may eventually cause the memory state of the cell to be misread.

Problems of data retention become worse as memory cell sizes decrease. FIG. 3 shows log (data retention time) for decreasing memory cell size (cell size decreases from left to right). While smaller device sizes are required to produce a competitive product, such reduced sizes bring problems of data retention. As charge storage elements become smaller and smaller, the number of electrons stored becomes so small that even a few lost electrons may be significant. In particular, in MLC cells, where threshold voltage may be divided into eight, sixteen or more threshold voltage ranges, small changes in threshold voltage may cause misreading. Where charge storage elements are small, such changes in threshold voltage may be caused by just a few electrons leaking. For some memory designs, such data retention problems are not significant for minimum feature sizes of approximately 40 nanometers, but are significant for minimum feature sizes of approximately 20 nanometers. While it is desirable to take advantage of smaller device size to reduce cost, data retention is a significant problem, in particular for certain important data where misreading may have serious consequences.

Figure 4:
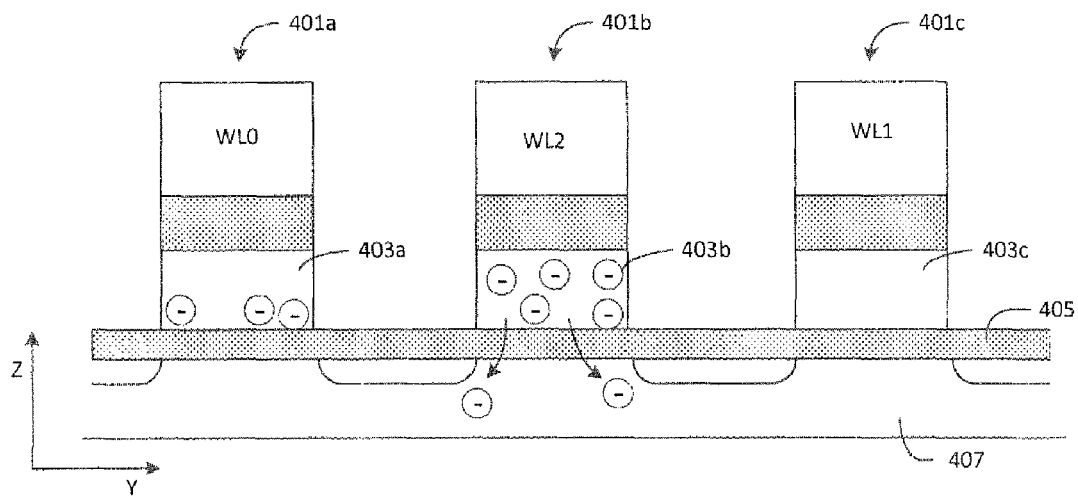
FIG. 4 shows a cross section of three NAND flash memory cells.

FIG. 4 shows a cross section of a portion of a NAND string that includes three memory cells 401a, 401b, and 401c. Each memory cell includes a charge storage element 403a, 403b, and 403c, which in this example are floating gates. Negative charge, in the form of electrons, is shown leaking from floating gate 403b of memory cell 401b, through the gate dielectric 405 (gate oxide) and into the channel region under the gate dielectric, in p-well 407.

It will be understood that smaller floating gates, and more highly charged floating gates have a greater tendency to leak charge in this manner because of the electrostatic forces between electrons. Thus, charge is shown leaking from floating gate 403b of memory cell 401b, while no charge is shown leaking from floating gate 403a, which has fewer electrons (less charge). Floating gate 403c has no charge and so does not suffer from charge leakage and remains in the uncharged state. Thus, more programmed memory cells (cells with more charged floating gates) suffer from more leakage than less programmed memory cells.

Figure 5:
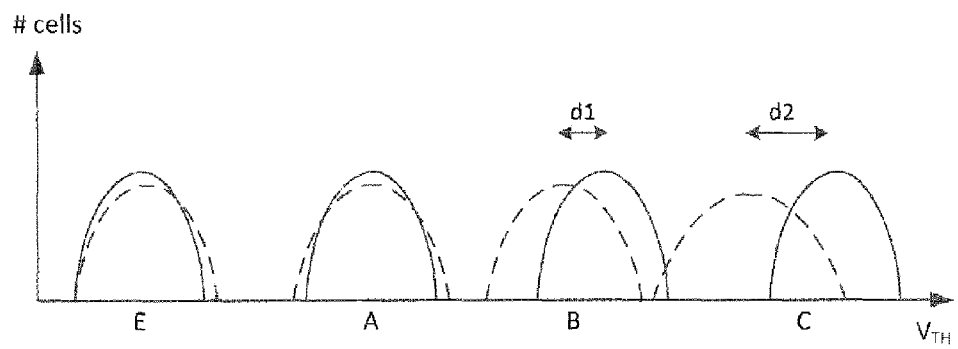
FIG. 5 shows shifting of threshold voltages from charge leakage.

FIG. 5 illustrates how charge leakage and other effects may cause threshold voltages ($V_{TH}$) of memory cells to shift, and how such threshold voltage shifts are worse for more charged memory cells. The threshold voltage distributions shown in FIG. 5 represent four different memory states (two bits per cell) for a number of memory cells (e.g. a page consisting of multiple sectors, each sector containing 512 bytes). Memory cells are initially programmed and verified at threshold voltages illustrated by the distributions shown with solid lines. Some memory cells remain in the erased state "E", while other memory cells are programmed to states A, B, and C by adding electrons to their floating gates.

Subsequent to the programming of the memory cells, charge leakage causes distributions to shift as illustrated by the distributions shown with dashed lines. For the erased state E and A state (lowest programmed state), there is little or no significant shift in threshold voltage distributions due to charge leakage because there is little or no charge in the floating gates of memory cells in these states. However, some changes in these distributions may occur due to other effects such as read disturb (changes caused by read operations) and write disturb (changes caused by write operations on adjacent cells). Thus, for example, erased memory cells in the E state may have a small amount of positive charge (small negative threshold voltage), while memory cells in the A state may have a small amount of negative charge (small positive threshold voltage). In contrast, it can be seen that the threshold voltage distribution for memory state B shows a significant shift, and the threshold voltage distribution for memory state C shows an even more significant shift. For each of these states, in addition to distributions becoming wider, distributions have shifted towards lower threshold voltages because of loss of electrons. Thus, the threshold voltage distribution for state B shifts an amount d1, while the threshold voltage distribution for state C shifts by a greater amount, d2. It can be seen that the shifted distribution for state C intersects the initial programmed distribution for state B. Thus, when the cells represented by these distributions are read, their shifted threshold voltages may cause some cells that were programmed to the C state to be read as being in the B state. As leakage continues, more of these cells develop (distribution for state C continues to extend lower) and some cells in state B may also lose sufficient charge so that they are read as being in the A state.

While this example shows a relatively simple case of four states with relatively large threshold voltage windows for each state, other examples may have eight, sixteen or more memory states with threshold voltage windows that are much narrower. In such cases, even very small shifts in threshold voltage may cause misreading.

According to aspects of the present invention, current leakage from a charge storage element such as a floating gate, may be prevented or reduced by applying a positive bias to a control gate that overlies the charge storage element. Such a positive bias counteracts the tendency of electrons to leak down through the gate dielectric by creating an electric field that provides an upward electrostatic force on electrons in the floating gate. By selecting an appropriate bias, this force can be large enough to substantially reduce, or eliminate, the tendency of electrons to leak from the floating gate down through the gate dielectric, while not being so large as to cause electrons to tend to leak significantly from the floating gate up through the inter-poly dielectric (IPD) to the control gate.

Figure 6:
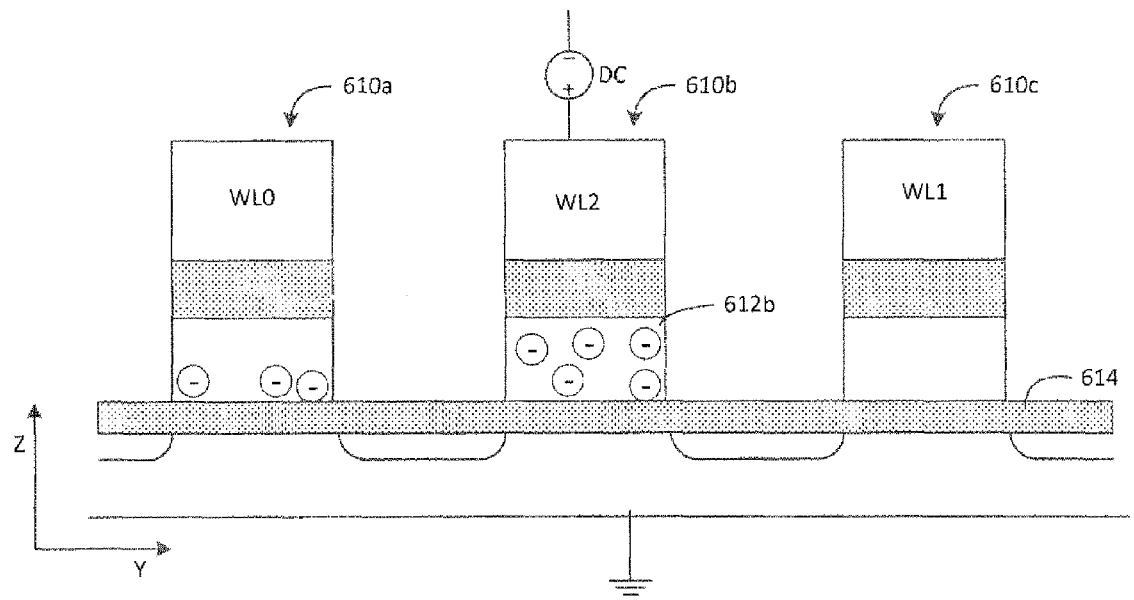
FIG. 6 shows a cross section of a NAND flash memory cell with a data retention bias.

FIG. 6 shows a cross section of memory cells 610a, 610b, and 610c of a NAND string that is similar to FIG. 4. However, FIG. 6 shows a Direct Current (DC) voltage source attached to word line WL 2. A positive DC voltage applied to WL2 creates an electric field that reduces or eliminates the tendency of electrons in the underlying floating gate 612b to leak down through the gate dielectric 614. The choice of a suitable voltage depends on the memory cell design and the charge levels to which memory cells are programmed. For example, a thinner gate oxide, smaller floating gate, or higher charge levels could be factors that would indicate a need for a greater bias. This bias is provided to a word line to improve the data retention of the cells along the word line and it may be considered a data retention bias.

It will be understood that control gates are formed where the word line overlies floating gates so that by biasing a word line, the control gates of all memory cells along that word line are biased. Thus, the data retention bias is not applied on a cell-by-cell basis in this design. Instead, it is applied on a word line by word line basis. Different floating gates along a word line generally have different levels of charge, so a data retention bias may be selected that provides the best net benefits over all charge levels (not just optimized for one charge level). In FIG. 6, only WL2 receives a data retention bias. WL0 and WL1 do not receive any data retention bias. Thus, a data retention bias may be selectively applied one or more selected word line, with other word lines remaining without any bias. In other cases, a data retention bias may be applied to all word lines in a block, or in a memory die.

While applying a voltage to a word line is well-known in connection with reading, programming, and erase operations, aspects of the present invention are directed to applying a data retention bias at other times, when no such operation is being performed. In contrast voltages applied during read and erase operations, the data retention bias is not applied to change the charge level in the charge storage elements, but to maintain the charge at the same level. And unlike voltages applied during reading, no data is read from memory cells along the word line receiving a data retention bias. Reading circuits may not be powered up at this time and bit lines generally do not have current flow and may not be biased. For example, a data retention bias may be applied when the memory array is idle, when no command is being executed in the memory array, no data is being read or programmed, and no block is being erased. In many cases, a memory array remains in such an idle condition for the majority of its useful life, with only occasional activity. For example, a memory array in a digital camera may remain idle until a user wants to take (or copy, or delete) a photo. A memory array in a music player may remain idle until a user wants to listen to (or download, or erase) music. Charge leakage during such extended idle periods may be counteracted by applying a data retention bias.

In general, applying a data retention bias to a word line results in some leakage of current from the word line. Where a word line has a relatively low leakage current, it may be charged up periodically and allowed to discharge so that it is maintained within a voltage range that is sufficient to provide a data retention improvement. In this way, circuits associated with providing a data retention bias may be powered down for extended periods of time and may then be powered up when needed. In other cases, a data retention bias may be applied as a continuous bias over an extended period and all circuits associated with providing the data retention bias may be powered up throughout.

Unlike other voltages that may be applied to particular elements of a memory array for short periods of time during operations such as reading, writing, and erasing, a data retention bias may be applied for an extended period of time. In general, it is desirable to perform reading, writing, and erasing operations as quickly as possible. Therefore, voltages that are applied in such operations are only applied for very short periods (e.g. millisecond or microsecond range). In contrast, a data retention voltage may be applied over a much longer period (e.g. seconds, minutes, hours, days, months, or even years).

In some cases, for example, where external power is available at all times, a data retention bias may be applied to all word lines whenever the word lines, or the dies containing the word lines are idle. However, in many cases, this may use more power than is desirable. Therefore, it may be desirable to use a data retention bias selectively. For example, the data retention bias may be applied to just one, or a few, word lines. Such word lines may be selected according to their leakage currents. For example, word lines may be charged up to a voltage retention bias and their leakage rates may be monitored to select word lines that have particularly low leakage currents. These word lines may then be configured to receive a data retention bias for improved data retention. Testing word lines to determine which are suitable, or unsuitable, for a data retention bias may be part of a configuration operation or an initialization operation. In some cases, there may be a pool of suitable word lines for a data retention bias, with a variable number of word lines receiving the data retention bias from time to time.

In some cases, particular word lines are selected for data retention because of their physical characteristics, which may be different from other word lines, and a data retention partition may be formed from such word lines (examples of word lines with physical characteristics suitable for data retention are described in U.S. patent application Ser. No. 13/658,292, filed on Oct. 23, 2012) In such memories, the word lines of the data partition, or some selected word lines of the data partition, may receive a data retention bias. Thus, no testing may be required because the design creates physically different word lines in a predetermined manner. In such memories, the number of word lines in a data retention partition is generally fixed by design. The number of word lines receiving a data retention bias may be similarly fixed, or may be variable (e.g. some variable subset of the word lines of the data retention partition).

Regardless, of how word lines are selected for a data retention bias, or how many are selected for a data retention bias, a memory system may assign data to such word lines in a manner that takes advantage of the improved data retention along those word lines. For example, critical data, such as boot page, file system data, or firmware may be stored along such word lines, with regular host data being stored along other word lines.

In addition to selection of particular word lines for a data retention bias, a memory system may select particular times when the data retention bias is to be applied so that a data retention bias is not used at all times that a memory die is idle, only at particular times. This may reduce power consumption. The probability of an electron leaking through a gate dielectric layer increases with increasing temperature. Therefore, in some examples, a data retention bias is applied selectively only at temperatures above a predetermined threshold temperature. A temperature sensor may be provided on a memory die to determine when the temperature exceeds the threshold temperature, or an input may be received from outside the die indicating when the temperature exceeds the threshold temperature. While a data retention bias may be a single, fixed voltage, it may also be a variable voltage that is modified according to conditions. Thus, a different data retention bias may be applied at different temperatures or depending on other conditions.

FIG. 7 shows an example of components of a memory die 720 that may be used in connection with aspects of the present invention. A memory array 722 is provided with a row decoder 724 that selects word lines of the memory array and applies suitable voltages to word lines during read, write, and erase operations. A word line bias generator 726 is connected to the row decoder in FIG. 7 so that a word line bias (data retention bias) may be provided to selected word lines when the memory die 720 is idle and certain conditions are met. The word line bias generator 726 also connects to a p-well control circuit 728 that may provide a bias to the p-well under the memory cells when the memory die 720 is idle and certain conditions are met. For example, the p-well control circuit may apply a negative bias to the p-well under all cells while all word lines are at 0 volts, or a small positive voltage. This provides another way to generate an electric field to counteract the tendency of electrons to leak from floating gates through a gate dielectric layer. Word line biasing can be used in combination with p-well biasing to achieve a suitable electric field. In other examples, only word lines are biased (no bias to p-well). The p-well may be biased with a negative bias in order to reduce the tendency of electrons to leak through the gate dielectric, or may be held at ground, or any suitable voltage. In some cases, additional circuits are connected to a word line bias generator so that additional components can be biased during idle conditions. Thus, data retention conditions applied in idle mode are not limited to word line bias but may include other conditions including p-well bias, common source bias, or other biases.

A temperature sensing circuit 730 is connected to the word line bias generator 726 and provides an input that indicates when the temperature of memory die 720 is above a predetermined temperature. In general, the predetermined temperature used depends on the design of the memory array and the tendency of electrons to leak as a function of temperature for that particular design. While the example shown uses a temperature sensing circuit 730 that is part of the memory die 720, in other examples, an external temperature sensing circuit may be used. The external temperature sensing circuit may, for example, be on a memory controller or Application Specific Integrated Circuit (ASIC) chip that is connected to the memory die through an interface. In other examples, no temperature sensing is needed.

An external interface 732 connects the memory die to the external world (e.g. to a memory controller). The external interface provides commands and power to the memory die. For example, a supply voltage Vcc may be provided through the external interface and a Chip Enable (CE) signal may be provided. In one example, when CE is off (die not selected) the memory die may initiate an idle state in which a data retention bias is applied to one or more word lines. An input voltage such as Vcc may be used as a data retention bias, or may be used to generate a data retention bias such as by generating a reduced voltage from Vcc. In general, Vcc is provided to the memory die even when it is idle (i.e. even when no command is performed). Other suitable voltages may also be used if available.

FIG. 8 shows a first example of a circuit 840 that may be used to generate a reduced voltage from Vcc. Vcc is supplied to one end of a series of forward biased diodes. A suitable number of such diodes may be chosen depending on the voltage used for Vcc. An output may be provided below each diode so that the available outputs $V_0, V_1, V_2$, etc. are stepped down from Vcc in increments. A suitable output voltage may be chosen for use as a word line bias voltage, or different output voltages may be chosen depending on conditions where a variable data retention bias is used. The voltage Vcc and the number of diodes between Vcc and the selected output determine the output voltage. Thus, a suitable output voltage can be conveniently selected.

FIG. 9 shows an alternative circuit for generating a reduced voltage from Vcc. A voltage divider uses two transistors T1, and T2, to generate an output voltage Vout that is reduced from Vcc. In particular, the designs of transistors T1, T2, and the selection of voltages applied to their gates ($V_{Gsel1}$ and $V_{Gsel2}$) may be chosen to provide a suitable voltage Vout. Alternative voltage dividers may use resistors, diodes, or other devices to produce a reduced voltage.

According to an example, a data retention bias may be applied to all word lines of a selected block. Such a data retention block may be used to store particularly important information. FIG. 10 shows an example of a memory die 101 that includes Block X, which is a data retention block with a data retention bias applied to all word lines when certain conditions are met. Decoding circuits 103 and block selection circuits 105 are used to select all word lines of block X for a word line bias voltage supplied by Vcc supply 107 (may be Vcc or some voltage derived from Vcc). A NAND voltage controller 109 controls whether to enable the word line bias voltage or not. In the example of FIG. 10, the NAND voltage controller 109 responds to a command controller 111 that determines whether to enable the word line bias or not depending on temperature as measured by a temperature sensor 113. The command controller 111 may be a memory controller on a separate die to memory die 101 (e.g. on an ASIC die). Temperature sensor 113 may also be on a separate die to memory die 101 (e.g. on same ASIC as command controller, or elsewhere).

The command controller 111 also communicates with a host controller 115 so that, in some cases, the memory controller can determine the likelihood that the host controller will send a command. Thus, the command controller 111 may initiate an idle mode when there are no host commands to be executed and there is a low probability of any new host commands (for example, if the host is in reduced power or hibernation mode). In some cases, a memory system may initiate idle mode after a predetermined period of time has passed since the last command. Some host controllers may issue commands to initiate an idle mode. In this case, the host does not expect to send commands soon but does expect to maintain power to the memory system (i.e. host is not preparing to remove power from memory system).

In some cases, the command controller is responsible for carrying out housekeeping operations in the memory array. For example, garbage collection or data scrubbing may be performed independently of the host controller. Thus, an idle mode may not be initiated where housekeeping operations are under way or need to be performed even if the host is idle and there are no host commands to execute. The command controller may initiate an idle mode only when a predetermined set of conditions are met. Such conditions may depend on the current condition of the host, the expected condition of the host, temperature, housekeeping operations, the importance of data being stored, the age or wear-count ("hot count" indicating number of program-erase cycles) of the memory (data retention diminishes with age or wear and can lead to wear-out), ECC statistics indicating increased errors (reduced data retention), the availability of external power, the level of battery power available, user-configurable power settings, or other factors. The conditions may be the same throughout the lifecycle of the product or may change over time in an adaptive manner (e.g. to compensate for wear or environmental conditions). The conditions used may be preset at the factory or may be configurable by a user or a host.

FIG. 11 shows a process for initializing an idle mode 120 in a memory die. The memory die, or memory controller, checks to see if the conditions for idle mode are met 122. When the conditions are met, idle mode is initiated 124. Then, during idle mode, the memory die, or memory controller checks for a new command 126. As long as there is no new command the memory die remains in idle mode. When a new command is received, idle mode is terminated 120 and the new command may be executed.

FIG. 12 shows the idle mode process (i.e. process initiated by step 124 of FIG. 11). It is first determined if it is appropriate to apply a data retention bias 130. For example, even where an idle mode has been initiated by a host or memory controller, a memory die with an on-chip temperature sensor may only apply a data retention bias when the temperature exceeds a threshold temperature. If a data retention bias is not appropriate then the die waits for appropriate conditions (e.g. temperature exceeding threshold temperature). If applying a data retention bias is appropriate then the data retention bias is generated from Vcc 132. An appropriate word line, or set of word lines (e.g. all word lines of a block, or blocks) are selected 134 and the selection information is used to configure the row decoder circuit appropriately. The bias is then applied to the selected word line 136, or word lines, through the row decoder circuit. This bias is then maintained for the duration of the idle mode (or is cycled to maintain a word line within some voltage window).

Figure 13:
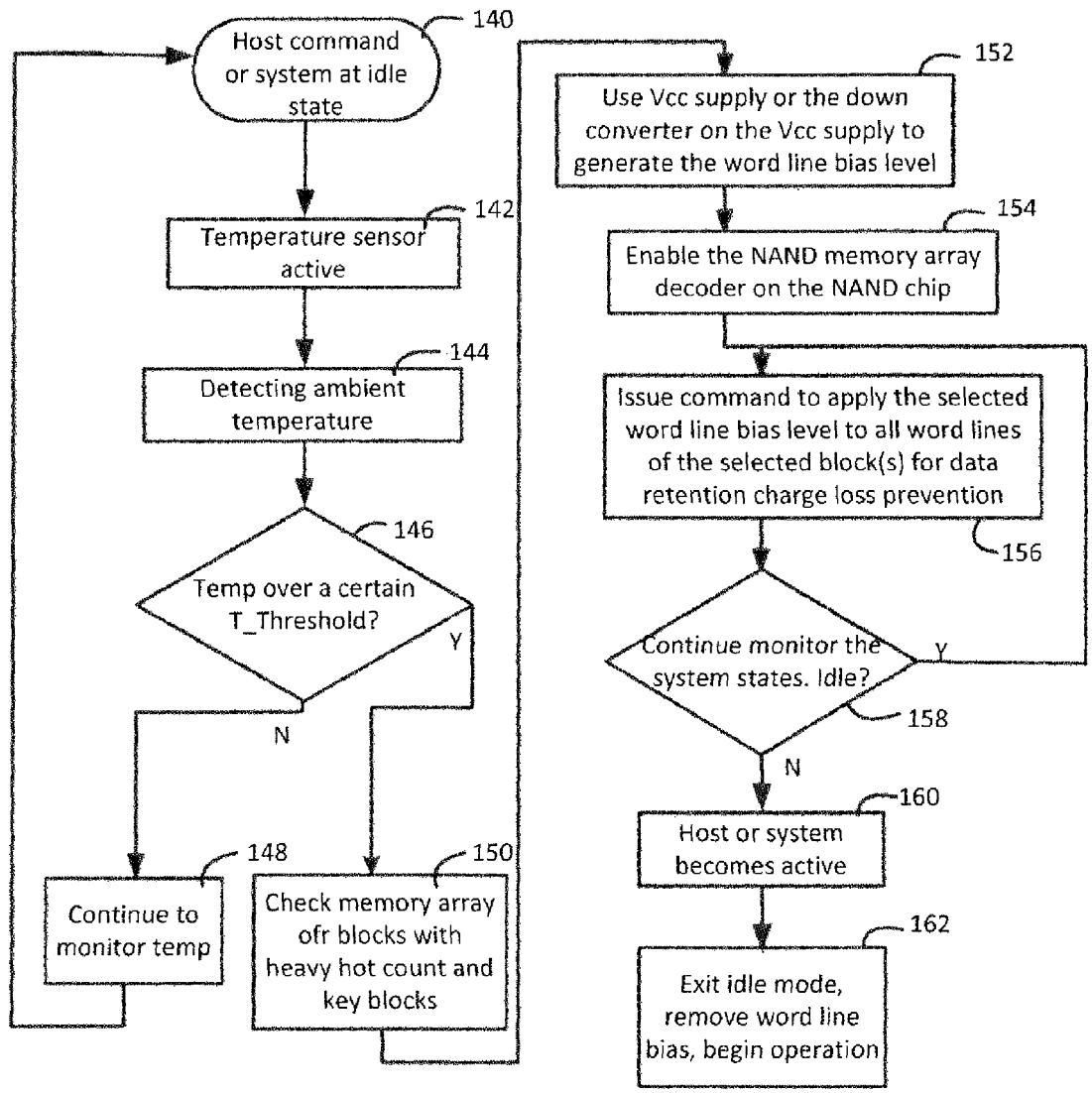
FIG. 13 is a flowchart for an example of idle mode initiation and execution.

FIG. 13 shows an example of a scheme for using a data retention bias in a NAND memory array. Initially, a host command may be received to initiate an idle mode, or the host system may be determined to be in an idle state 140. A temperature sensor is activated 142 (if not already active). The ambient temperature is detected 144 and it is determined whether the ambient temperature exceeds a predetermined threshold temperature 146. If the ambient temperature does not exceed the threshold temperature, the system continues to monitor temperature 148. If the temperature exceeds the threshold temperature then the memory is checked for blocks with heavy hot counts (i.e. a lot of wear) and blocks with key data 150. The VCC supply, or a down-converter on the VCC supply, is then used to generate a word line bias 152. The row decoder circuits are enabled 154 and a command is issued to apply the word line bias to all word lines of a particular block, or blocks, for data retention (i.e. to prevent charge loss) 156. These may be blocks with high hot counts, or key blocks, or other blocks that are identified as suitable for a data retention bias under the circumstances. The system states are monitored to see if the system remains idle 158. As long as the system remains idle, the word line biases are maintained. If the host or system becomes active 160 then the system exits idle mode and starts execution of the host command or system operation 162.

While the above examples describe particular techniques for improving data retention, these techniques are not limiting and may be combined with other techniques to provide improved data retention. For example, scrubbing of data, use of particular programming schemes and encoding schemes, and memory cell design may be used in conjunction with aspects described above in order to improve data retention in flash memory cells.

Conclusion

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

It is claimed:

1. A method of operating a nonvolatile charge storage memory die comprising:
   selectively applying a data retention bias to a word line that overlies a plurality of programmed charge storage elements, during an idle period when the nonvolatile charge storage memory die is idle, in response to a determination that (a) temperature of the nonvolatile charge storage memory die exceeds a predetermined temperature (b) the plurality of programmed charge storage elements contain data that is particularly important, or (c) the plurality of programmed charge storage elements have a high wear-count.

2. The method of claim 1 wherein the data retention bias reduces the probability of change in charge stored in the plurality of charge storage elements underlying the word line during the idle period.

3. The method of claim 1 further comprising: sensing temperature of the nonvolatile memory, and wherein selectively applying the data retention bias is in response to determining that the temperature of the nonvolatile charge storage memory die exceeds the predetermined temperature.

4. The method of claim 1 wherein selectively applying the data retention bias to the word line is in response to determining that the plurality of programmed charge storage elements contain data that is particularly important, and wherein no data retention bias is applied to other word lines of the nonvolatile charge storage memory die.

5. The method of claim 1 wherein selectively applying the data retention bias to the word line is in response to determining that the plurality of programmed charge storage elements have a high wear-count, and wherein no data retention bias is applied to other word lines of the nonvolatile charge storage memory die.

6. The method of claim 1 wherein the data retention bias is applied as a continuous bias over the idle period, and the idle period is more than a minute.

7. The method of claim 1 wherein all bit lines coupled to the plurality of charge storage units are at a uniform potential during the idle period.

8. A nonvolatile charge storage memory die comprising:
   a plurality of nonvolatile memory cells each including a charge storage element;
   a plurality of word lines extending in a first direction, each word line overlying charge storage elements;
   a word line bias generator that provides a data retention bias to a word line of the plurality of word lines during an idle period when the memory die is idle; and
   a temperature detection circuit that detects when the temperature of the nonvolatile memory die exceeds a threshold temperature, the temperature detection circuit having an output that indicates when the temperature exceeds the threshold temperature, the output connected to the word line bias generator.

9. The nonvolatile memory die of claim 8 further comprising: a word line decoder circuit connected between the word line bias generator and the plurality of word lines, the word line decoder circuit selecting the word line of the plurality of word lines for the data retention bias and while not selecting other word lines of the plurality of word lines.

10. The nonvolatile memory die of claim 9 wherein the word line decoder circuit selects two or more word lines of the plurality of word lines for the data retention bias while not selecting all other word lines of the plurality of word lines for the data retention bias, the two or more word lines of the plurality of word lines selected in response to a determination that data stored in memory cells of the two or more word lines is of particular importance, or a determination that memory cells of the two or more word lines have a high wear count.

11. The nonvolatile memory die of claim 8 wherein the word line bias generator receives an input at a voltage that is a supply voltage, from a source external to the nonvolatile memory die, and generates the data retention bias, which is a fraction of the supply voltage.

12. The nonvolatile memory die of claim 11 wherein the word line bias generator includes a plurality of junctions connected in series, with a predetermined voltage drop across each junction, and an electrical output available at each junction, the data retention bias provided by the electrical output of a selected junction that is a selected number of predetermined voltage drops lower than the supply voltage.

13. The nonvolatile memory die of claim 11 wherein the word line bias generator includes a voltage divider with a variable voltage output.

14. The nonvolatile memory die of claim 13 wherein the data retention bias is selected from the variable voltage output such that the data retention bias is sufficient to reduce the probability of electron loss for charge storage elements under the word line and is not sufficient to cause electrons to be added to charge storage elements under the word line.

15. A method of maintaining data in a charge storage element of a flash memory array comprising:
initiating an idle mode in response to determining that a supply voltage is expected to be maintained to the flash memory array, and that no read, write, or erase operations are to be performed in the flash memory array; and
subsequently, in idle mode:
generating a bias from the supply voltage;
selecting a word line of the flash memory array that connects a plurality of memory cells that are identified as (a) containing data of high importance and/or (b) having high wear-counts;
selectively applying the bias to the word line while not applying the bias to other word lines of the flash memory array; and
maintaining the idle mode until a command is received.

\* \* \* \* \*